(12) United States Patent
Polisetti et al.

(10) Patent No.: US 7,721,146 B2
(45) Date of Patent: May 18, 2010

(54) METHOD AND SYSTEM FOR BAD BLOCK MANAGEMENT IN RAID ARRAYS

(75) Inventors: Suri B. Polisetti, Bangalore (IN); William P. Dawkins, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 528 days.

(21) Appl. No.: 11/467,415

(22) Filed: Aug. 25, 2006

(65) Prior Publication Data
US 2007/0294570 A1 Dec. 20, 2007

(30) Foreign Application Priority Data
May 4, 2006 (IN) .................. 1123/DEL/2006

(51) Int. Cl.
*G06F 11/00* (2006.01)
(52) U.S. Cl. .................. 714/8; 714/5; 714/6; 714/7; 714/42
(58) Field of Classification Search .............. 714/5, 714/6, 7, 8, 42; 711/114
See application file for complete search history.

(56) References Cited

U.S. PATENT DOCUMENTS

| | | | |
|---|---|---|---|
| 5,657,439 A * | 8/1997 | Jones et al. .................. 714/7 |
| 5,826,001 A | 10/1998 | Lubbers et al. ......... 395/182.04 |
| 5,913,927 A | 6/1999 | Nagaraj et al. ................. 714/8 |
| 5,974,544 A * | 10/1999 | Jeffries et al. .................. 714/8 |
| 6,745,284 B1 * | 6/2004 | Lee et al. ........................ 714/6 |
| 6,775,791 B2 | 8/2004 | McAfee ........................ 714/6 |
| 6,854,071 B2 | 2/2005 | King et al. ..................... 714/8 |
| 6,944,791 B2 | 9/2005 | Humlicek et al. .............. 714/6 |
| 6,959,413 B2 | 10/2005 | Humlicek et al. ........... 714/807 |
| 7,130,973 B1 * | 10/2006 | Chong et al. ................... 714/8 |
| 7,281,089 B2 * | 10/2007 | Thompson et al. ............. 714/8 |
| 7,409,585 B2 * | 8/2008 | Ali ................................ 714/8 |
| 7,418,621 B2 * | 8/2008 | Ashmore ....................... 714/6 |
| 2003/0217305 A1 * | 11/2003 | Krehbiel et al. ................ 714/6 |
| 2004/0196707 A1 | 10/2004 | Yoon et al. .................. 365/200 |
| 2004/0199515 A1 * | 10/2004 | Penny et al. ................ 709/223 |
| 2005/0073899 A1 | 4/2005 | Gallivan et al. ............. 365/232 |

OTHER PUBLICATIONS

ZFS: the last word in file systems, www.sun.com/2004-0914/feature, 4 pages, 2007.
Enterprise Volume Management System, www.evms.sourceforge.net/, 1 page, 2007.
Think CP Technologies, Think ViPoR 12i Rackmount RAID, www.thinkcp.com/products/ViPoRRaid12i.asp, 3 pages, 2006.

* cited by examiner

*Primary Examiner*—Robert Beausoliel
*Assistant Examiner*—Joseph D Manoskey
(74) *Attorney, Agent, or Firm*—Baker Botts L.L.P.

(57) ABSTRACT

A system and method for managing bad blocks that utilizes a remapping pool formed across an array of disks to remap bad blocks formed on individual disks. When a bad block is discovered in a particular disk the bad block is then remapped within the remapping pool and is stored across multiple disks.

20 Claims, 2 Drawing Sheets

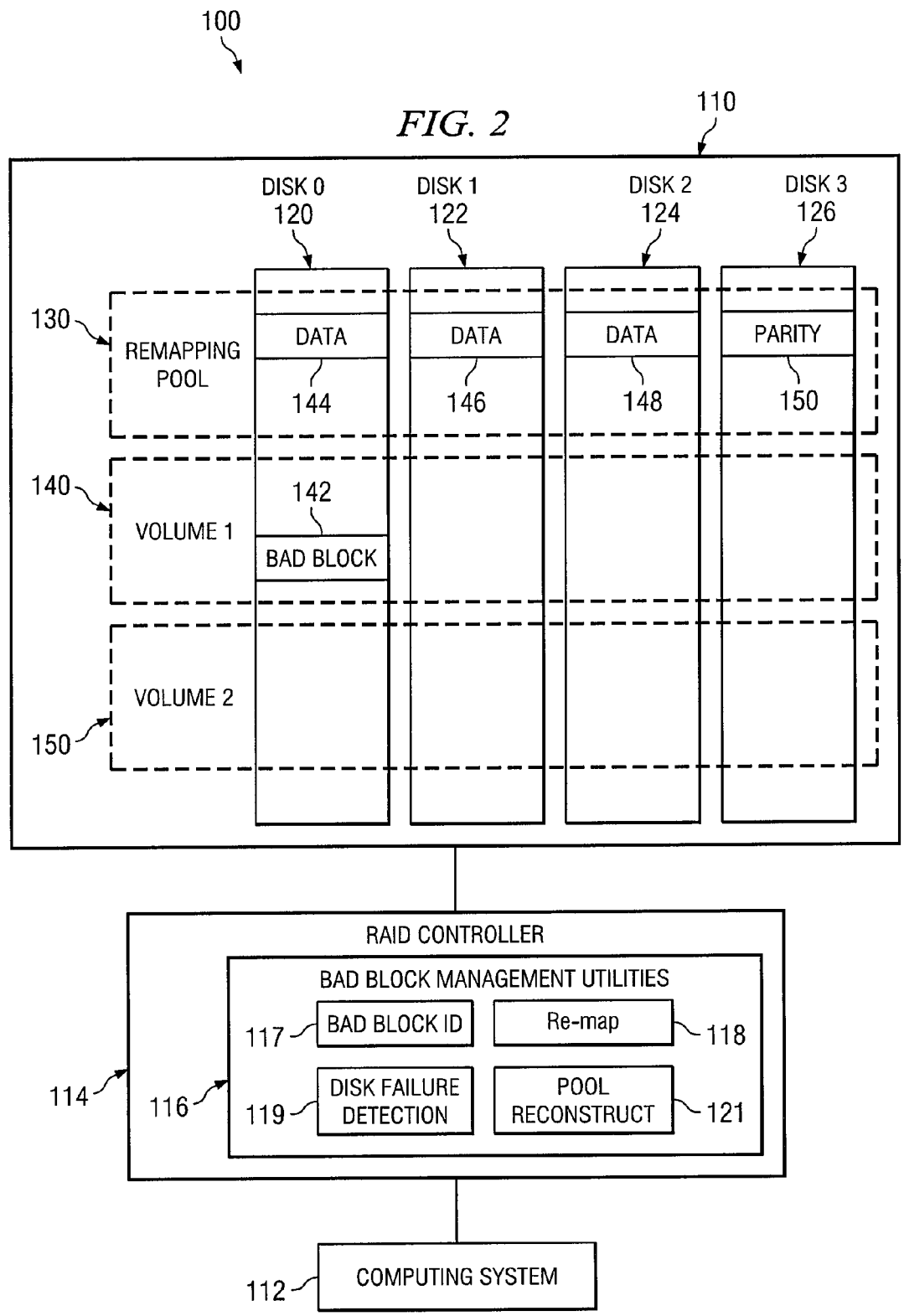

METHOD AND SYSTEM FOR BAD BLOCK MANAGEMENT IN RAID ARRAYS

TECHNICAL FIELD

The present invention is related to the field of computer systems and more specifically to a method and system for bad block management in a RAID array.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information storage is invaluable to organizations and critical to the effective use and operation of information handling systems. A basic component of storage systems are individual storage components such as hard drives. However, hard drives are susceptible to so-called bad blocks which are damaged, corrupted or malfunctioning portions of a memory which can jeopardize data availability or otherwise degrade the data integrity of a storage system. Bad blocks may result from a variety of factors such as damage to a media surface, manufacturing defects, environmental factors, excessive grown defect list (GLIST) entries, etc. These bad blocks may compromise the data integrity of a storage system such as a RAID system.

Current hard drives provide a mechanism for mapping bad blocks to another location within the drive. However, with the increasing size of disk drives the area used for remapping bad blocks has also increased. However, the actual number of blocks that will be remapped to this reserved location will vary with each individual drive. As a result, for information handling systems that employ multiple drives, in any particular drive the reserved location may be used entirely while, for another drive, the reserved location may largely go unused. For a drive with a larger number of bad blocks the reserved location may not be large enough to accommodate remapping all of the bad blocks and the hard drive must be replaced.

SUMMARY OF THE INVENTION

Therefore a need has arisen for a system and method for managing bad blocks in an array of storage disks utilizing a remapping pool formed across multiple disks.

The present disclosure describes a system and method for managing bad blocks that utilizes a remapping pool formed across an array of disks to remap bad blocks formed on individual disks. When a bad block is discovered in a particular disk the bad block is then remapped within the pool of disks and is stored across multiple disks using, for instance, a selected RAID protocol. In this manner, the present disclosure describes an advantageous approach to managing bad blocks in an array of storage devices.

In one aspect an information handling system is disclosed that includes a storage system made up of multiple storage disks. A remapping pool is formed from a portion of two or more of the storage disks. A computing system including a storage controller is in communication with the storage system. The storage controller is configured to identify a bad block within one of the storage disks and remap data that was to be stored in the bad block to the remapping pool such that the remapped data is stored across portions of two or more of the storage disks.

In another aspect, a storage controller is described for managing bad blocks within a storage system. The storage controller includes a bad block identification utility and a remapping utility. The bad block identification utility is configured to monitor multiple storage disks and to identify bad blocks with the storage disks. The remapping utility is configured to remap the identified bad block to a remapping pool that is formed from portions of the plurality of storage disks or from the multiple storage disks.

In yet another aspect, a method for managing bad blocks is disclosed. The method includes forming a remapping pool across a plurality of storage disks and identifying a bad block within one of the storage disks. The method also includes remapping data that was to be stored in the bad block to the remapping pool.

The present disclosure includes a number of important technical advantages. One important technical advantage is the use of a remapping pool that is formed from portions of multiple storage disks. The remapping pool expands the availability of the allotted space for remapping bad blocks across the array of disks and allows the available space across the array to be utilized in a more uniform manner. Additional advantages will be apparent to those of skill in the art from the figures, description and claims provided herein.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein:

FIG. 2 shows an array of disks having a remapping pool in accordance with teachings of the present disclosure.

DETAILED DESCRIPTION OF THE INVENTION

Figure 3:
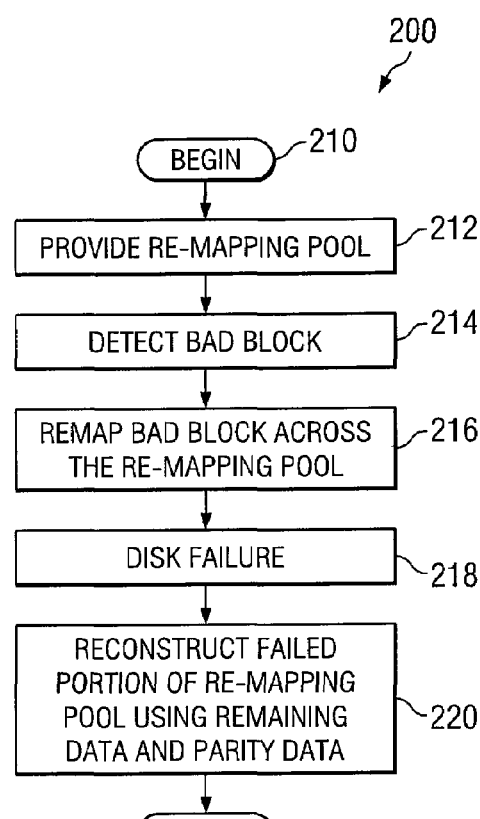
FIG. 3 shows a flow diagram of a method according to teachings of the present disclosure.

Preferred embodiments of the invention and its advantages are best understood by reference to FIGS. 1-3 wherein like numbers refer to like and corresponding parts and like element names to like and corresponding elements.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1A:
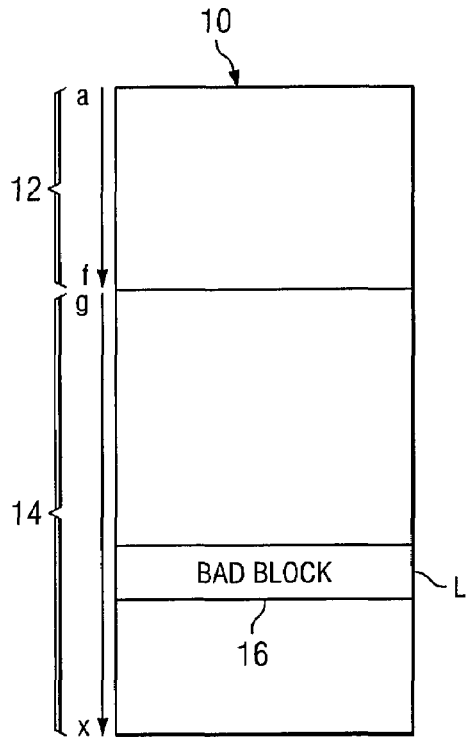
FIG. 1A shows a storage disk having a bad block.

Now referring to FIG. 1A a graphical representation of a storage drive, indicated generally at 10, is shown. Storage drive 10 includes multiple blocks shown as blocks a-x and divided between a reserved portion 12 (blocks a-f) and an unreserved portion 14 (blocks g-x). In the present embodiment, reserved portion 12 is reserved for the remapping of bad blocks which are detected within storage drive 10 and unreserved portion 14 is used for the normal storage of data within storage drive 10. As shown, bad block 16 has been discovered within block L of the present embodiment. It should be understood that the representation of the storage drive 10 is provided for exemplary purposes only and that the description of the number of blocks and the allocation of blocks is provided only as an example. The present disclosure is not limited to drives of any particular size, block size or allocation of bad block remapping space.

Figure 1B:
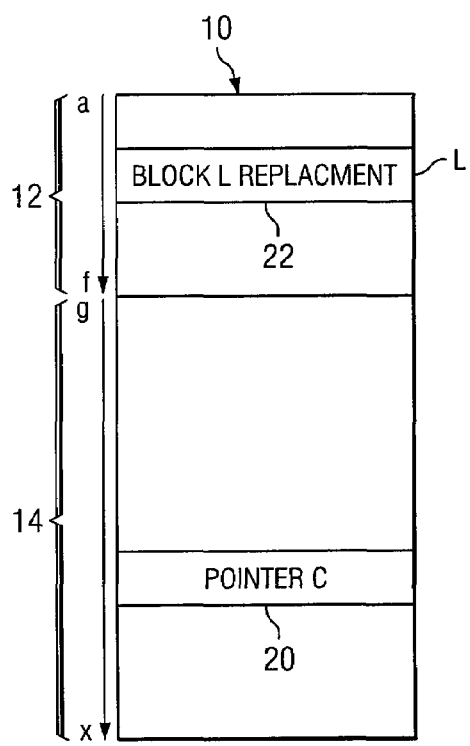
FIG. 1B shows a storage disk after replacing a bad block within a reserved portion.

Now referring to FIG. 1B, storage drive 10 is shown following the remapping of block L within reserved portion 12 and more specifically within replacement block 22. Additionally a pointer 20 has been placed within unreserved portion 14 such that any device searching for block L at its previous location may preferably be directed by pointer 20 to block L replacement block 22 within reserved portion 12. It should be understood that other mechanisms can be used to indicate that a bad block has been remapped, such as a mapping table located at another reserved or unreserved location. FIGS. 1A and 1B show a typical existing bad block management scheme for a single drive.

Now referring to FIG. 2, an information handling system indicated generally at 100 is shown. Information handling system 100 generally includes a storage system 110 in communication with computing system 112 and a storage controller 114. In the present embodiment, storage controller 114 is shown as an external component with respect to computing system 112. However, in alternate embodiments storage controller 114 may be embedded within computing system 112.

Storage system 110 includes multiple disks: zero disk 120, first disk 122, second disk 124 and third disk 126. Disks 120, 122, 124 and 126 may comprise a RAID array and may each comprise hard drives. However, in alternate embodiments disks 120, 122, 124 and 126 may be SCSI drives, SAS drives, SATA drives, IDE drives, flash memory drives, solid state memory devices, fibre channel drives or any other suitable memory device or combination thereof. A remapping pool 130 is formed across disks 120, 122, 124 and 126 such that a portion of each disk is reserved and included within the remapping pool 130. Remapping pool 130 may also be referred to as "Shared Block Space". Additionally, in the present embodiment a first storage volume 140 and a second storage volume 150 may preferably be formed across portions of disks 120, 122, 124 and 126. Each storage volume 140 and 150 includes a portion of each of the storage disks. In operation, first storage volume 140 or second storage volume 150 may be used to store information across the array of disks using any selected protocol such as, for instance, a selected RAID protocol.

In the present embodiment a bad block 142 is identified within zero disk 120. Data that was to be stored within bad block 142 has subsequently been remapped within remapping pool 130. One portion of the data 144 has been mapped within disk 120, a second portion of the data 146 has been remapped within disk 122, a third portion of the data 148 has been remapped within a portion of disk 124. Additionally parity information 150 has been mapped within a portion of third disk 126. In a particular embodiment, information from bad block 142 has been stored within portions 144, 146, 148 and 150 utilizing a selected RAID protocol, such as RAID 5. In alternate embodiments data from bad block 142 may be stored across remapping pool 130 using any suitable scheme or protocol, including protocols that do not utilize parity information. Additionally it should be noted that data may be stored within first storage volume 140 and second storage volume 150 using one protocol and data that is subsequently stored within remapping pool may be stored utilizing the same protocol or may be stored using a different protocol. For example, bad block data may be stored within remapping pool using RAID 5 and information may be stored within first storage volume 140 and second storage volume 150 using RAID 1. In another example, bad block data may be stored within remapping pool using RAID 5 and information may be stored within first storage volume 140 and second storage volume 150 using RAID 5. However, First storage volume 140 and second storage volume 150 need not be of same Raid Level and may be configured according to different Raid levels. For example, The first storage volume 140 may be configured according to RAID5 having 4 disks and second storage volume 150 may be configured according to RAID1 or RAID0. Alternately, second storage volume 150 may be split into two volumes, each containing two drives which may be configured according to the same or differing RAID levels. The management of bad block 142 as well as any other bad blocks discovered within any of disks 120, 122, 124 and 126 are preferably managed by storage controller 114. In one embodiment storage controller 114 may be a RAID controller. Storage controller preferably monitors storage system 110 utilizing bad block management utilities 116. In alternate embodiments storage controller may be configured to receive notification of the identification of a bad block from another utility associated with either computing system 112 or storage system 110. Bad block management utility 116 generally includes bad block identification module 117, remapping utility 118, disk failure detection utility 119 and pool reconstruction utility 121. Bad block identification utility 117 is preferably configured to monitor storage disks 120, 122, 124 and 126 and identify any bad blocks within the storage disks such as bad block 142. Remapping utility 118 is configured to remap the identified bad block to remapping pool 130 and to then store the remapped data across multiple disks. Disk failure detection module 119 monitors disks 120, 122, 124 and 126 to detect when an entire disk has failed. Pool reconstruction module 121 is configured to reconstruct remapping pool 130 utilizing the remaining data from the non-failed disks.

For example, if disk 122 were to fail and data portion 146 were no longer available, pool reconstruction module 121 would preferably reconstruct data portion 146 using data 144, data 148 and parity information 150 and utilizing the appropriate protocol such as the RAID protocol under which data was spread across remapping pool 130.

It should be noted that in the present embodiment storage system 110 includes four disks. In alternate embodiments storage system 110 may include more or fewer disks. Additionally storage controller 114 may manage multiple storage systems each including multiple disks. Storage system 110 is presently shown with two storage volumes 140 and 150. In alternate embodiments more or fewer storage volumes may be maintained within storage system 110.

Now referring to FIG. 3, a flow chart showing a method generally indicated at 200 according to the present disclosure is shown. The method begins 210 by first establishing or providing a remapping pool 212. Remapping pool may preferably be set by the firmware associated with the controller which also handles the Raid functionality. In embodiments that include a separate chip on the controller itself (as is the case with some RAID engines on some of the controllers) to manage the RAID functionality, then this chip may handle the configuration and management of the remapping pool.

Next, the method includes detecting a bad block 214 within one of the storage disks within an array of disks. The method next includes remapping the identified bad block across the remapping pool 216. The method also includes detecting a disk failure 218 within one of the disks within the array of disks. Next, the failed portion of the remapping pool is reconstructed using the remaining data in the other portions of the remapping pool 220 and thereby completing the method 222.

Although the disclosed embodiments have been described in detail, it should be understood that various changes, substitutions and alterations can be made to the embodiments without departing from their spirit and scope.

What is claimed is:

1. An information handling system comprising:
    a storage system comprising a plurality of storage disks;
    a remapping pool comprising a portion of two or more of the storage disks;
    a computing system in communication with the storage system, the computing system having a storage controller associated therewith configured to:
        indentify a bad block within one of the storage disks; and
        remap data to be stored in the bad block to the remapping pool such that the remapped data is stored across two or more of the storage disks.

2. The information handling system of claim 1 wherein the storage controller comprises a RAID array.

3. The information handling system of claim 1 wherein the storage controller comprises a RAID controller.

4. The information handling system of claim 3 wherein the RAID controller is embedded within the computing system.

5. The information handling system of claim 3 wherein the RAID controller comprises an external component in communication with the computing system.

6. The information handling system of claim 1 where the storage disks comprise hard drives.

7. The information handling system of claim 1 wherein the storage disks comprise storage media selected from the group consisting of SCSI drives, SAS drives, SATA drives, IDE drives, flash memory drives and solid state memory.

8. The information handling system of claim 1 further comprising one or more storage volumes, wherein each storage volume comprises a portion of each of the storage disks.

9. The information handling system of claim 1 further comprising the storage controller operable to remap the bad block data to the remapping pool using a first selected RAID level.

10. The information handling system of claim 9 further comprising the storage controller operable to map data to at least one storage volume formed in the storage system according to the first selected RAID level.

11. The information handling system of claim 9 further comprising the storage controller operable to map data to at least one storage volume formed in the storage system according to a second selected RAID level.

12. The information handling system of claim 9 wherein the storage controller is operable to detect a disk failure within the plurality of storage disks and to reconstruct the failed portion of the remapping pool in accordance with the first selected RAID level and the remaining portion of the remapping pool.

13. A storage controller for managing bad blocks in a storage system comprising:
    a bad block identification utility configured to monitor a plurality of storage disks and identify at least one bad block within one of the plurality of storage disks; and
    a remapping utility configured to remap the at least one identified bad block to a remapping pool formed from portions of the plurality of storage disks, such that remapped data associated with the at least one identified bad block is stored across two or more of the plurality of storage disks.

14. The storage controller of claim 13 wherein the remapping utility is configured to remap the at least one identified bad block to the remapping pool using a first selected RAID protocol.

15. The storage controller of claim 13 wherein the plurality of storage disks comprise a RAID array.

16. The storage controller of claim 13 wherein the plurality of storage disks comprise at least one storage media selected from the group consisting of SCSI drives, SAS drives, SATA drives, IDE drives, flash memory drives and solid state memory.

17. The storage controller of claim 13 further comprising:
    a disk failure detection module configured to detect a failed disk within the plurality of storage disks, the failed disk having a portion of the remapping pool formed thereon; and
    a reconstruction module configured to reconstruct the failed portion of the remapping pool based upon the portions of the remapping pool on the remaining non-failed storage disks.

18. A method for managing bad blocks comprising:
    forming a remapping pool across a plurality of storage disks;
    identifying a bad block with one of the plurality of storage disks;
    remapping data to be stored in the bad block to the remapping pool such that the remapped data is stored across two or more of the plurality of storage disks.

19. The method of claim 18 further comprising:
    detecting the failure of one of the plurality of storage disks containing a portion of the remapping pool; and
    reconstructing the failed portion of the remapping pool using the remaining portions of the remapping pool stored on the remaining non-failed disks.

20. The method of claim 18 comprising remapping the bad block data to the remapping pool using a first selected RAID protocol.

* * * * *